United States Patent [19]

Frankeny et al.

[11] Patent Number: 4,975,637

[45] Date of Patent: Dec. 4, 1990

[54] METHOD AND APPARATUS FOR INTEGRATED CIRCUIT DEVICE TESTING

[75] Inventors: Richard F. Frankeny, Elgin; Karl Hermann, Austin, both of Tex.

[73] Assignee: International Business Machines Corporation, Armonk, N.Y.

[21] Appl. No.: 459,088

[22] Filed: Dec. 29, 1989

[51] Int. Cl.$^5$ .......................... G01R 1/02; G01R 1/04
[52] U.S. Cl. .............................. 324/158 F; 324/72.5; 324/158 P; 437/8
[58] Field of Search ............ 324/158 P, 158 F, 158 R, 324/72.5; 439/482

[56] References Cited

U.S. PATENT DOCUMENTS

| | | | |
|---|---|---|---|
| 4,087,747 | 5/1978 | Deegen et al. | 324/158 P |
| 4,270,109 | 5/1981 | Riessland et al. | 324/158 F |

FOREIGN PATENT DOCUMENTS

| | | | |
|---|---|---|---|
| 0165236 | 9/1964 | U.S.S.R. | 324/158 F |

OTHER PUBLICATIONS

"Film Supported Probe for the AC Pulse Testing of Integrated Circuits", by Dill et al., vol. 10, #10, 3/68, pp. 1466–1467.

*Primary Examiner*—Reinhard J. Eisenzopf
*Assistant Examiner*—William Burns
*Attorney, Agent, or Firm*—Andrew J. Dillon

[57] ABSTRACT

A method and apparatus are disclosed for testing integrated circuit devices. A ferromagnetic test substrate is manufactured, utilizing a process substantially similar to the process utilized to create the integrated circuit devices to be tested, such that the test substrate and the integrated circuit devices are thermally matched. The test substrate preferably includes a plurality of electrical contact points which correspond to a plurality of electrical contact points within the integrated circuit device. By aligning the ferromagnetic test substrate and integrated circuit device to be tested in a position proximate to an electromagnet and selectively energizing the electromagnet, the electrical contact points within the ferromagnetic test substrate are magnetically urged into contact with the electrical contact points within the integrated circuit device. An integrated circuit device tester is then electrically coupled to the ferromagnetic test substrate and utilized to test each integrated circuit device during this magnetically induced electrical connection. In one embodiment of the present invention, a second electromagnet having a magnetic polarity opposite that of the first electromagnet is provided and positioned opposite the first electromagnet such that upon energization the electromagnets are urged together, further ensuring electrical contact between the test substrate and the integrated circuit device. In this embodiment, a flexible cushion is provided to equally distribute the pressure between the two electromagnets.

14 Claims, 2 Drawing Sheets

METHOD AND APPARATUS FOR INTEGRATED CIRCUIT DEVICE TESTING

BACKGROUND OF THE INVENTION

1. Technical Field:

The present invention relates in general to the field of integrated circuit device testing and in particular to methods for testing integrated circuit devices which are to be directly mounted without traditional packaging. Still more particularly, the present invention relates to methods for accurately and rapidly temporarily interconnecting an integrated circuit device and an integrated circuit device tester.

2. Description of the Related Art:

Integrated circuit device testing, sometimes referred to as "burn-in" testing, is a common practice in the electronics industry. In order to weed out so-called "infant death" failures, manufactures of integrated circuit devices and equipment which utilizes such devices often subject these integrated circuit devices to repeated testing cycles in an environmentally controlled chamber or "oven" in order to detect those devices which may fail during initial utilization.

Very often this testing is accomplished by manually inserting multiple integrated circuit devices which are mounted within traditional dual-in line-packaging into appropriate test sockets in a test fixture. The test fixture is then coupled to an appropriate power and signal source and the integrated circuit devices are then subjected to repeated cycles of operation within a heated chamber While the aforementioned technique works well for traditionally packaged integrated circuit devices which may be manually inserted into appropriate sockets, many modern electronic devices utilize direct mount integrated circuit devices which are not contained within a package. With such devices it is much more difficult to handle the device and, of course, still more difficult to test such devices since test sockets may not be utilized.

It should therefore be apparent that a need exists for a method and apparatus which permits the rapid and accurate testing of integrated circuit devices which are not mounted within traditional packaging.

SUMMARY OF THE INVENTION

It is therefore one object of the present invention to provide an improved method of testing integrated circuit devices.

It is another object of the present invention to provide an improved method of testing integrated circuit devices which are to be directly mounted to a substrate without traditional packaging.

It is yet another object of the present invention to provide an improved method of testing integrated circuit devices which are to be directly mounted to a substrate without traditional packaging which permits the rapid and accurate temporary interconnection of such devices to a device testing apparatus.

The foregoing objects are achieved as is now described. A ferromagnetic test substrate is manufactured, utilizing a process substantially similar to the process utilized to create the integrated circuit devices to be tested, so that the test substrate and the integrated circuit devices are thermally matched. Each test substrate preferably includes a plurality of electrical contact points which correspond to a plurality of electrical contact points within the integrated circuit device to be tested. By aligning the ferromagnetic test substrate and integrated circuit device together in a position proximate to an electromagnet and thereafter selectively energizing the electromagnet, the electrical contact points within the ferromagnetic test substrate are magnetically urged into contact with the electrical contact points within the integrated circuit device. An integrated circuit device tester is then electrically coupled to the ferromagnetic test substrate and utilized to test each integrated circuit device during the magnetically induced electrical connection. In one embodiment of the present invention, a second electromagnet having a magnetic polarity opposite that of the first electromagnet is provided and positioned opposite the first electromagnet such that upon energization the electromagnets are urged together, further ensuring electrical contact between the test substrate and the integrated circuit device. In this embodiment, a flexible cushion is provided to ensure equal distribution of the pressure between the two electromagnets.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
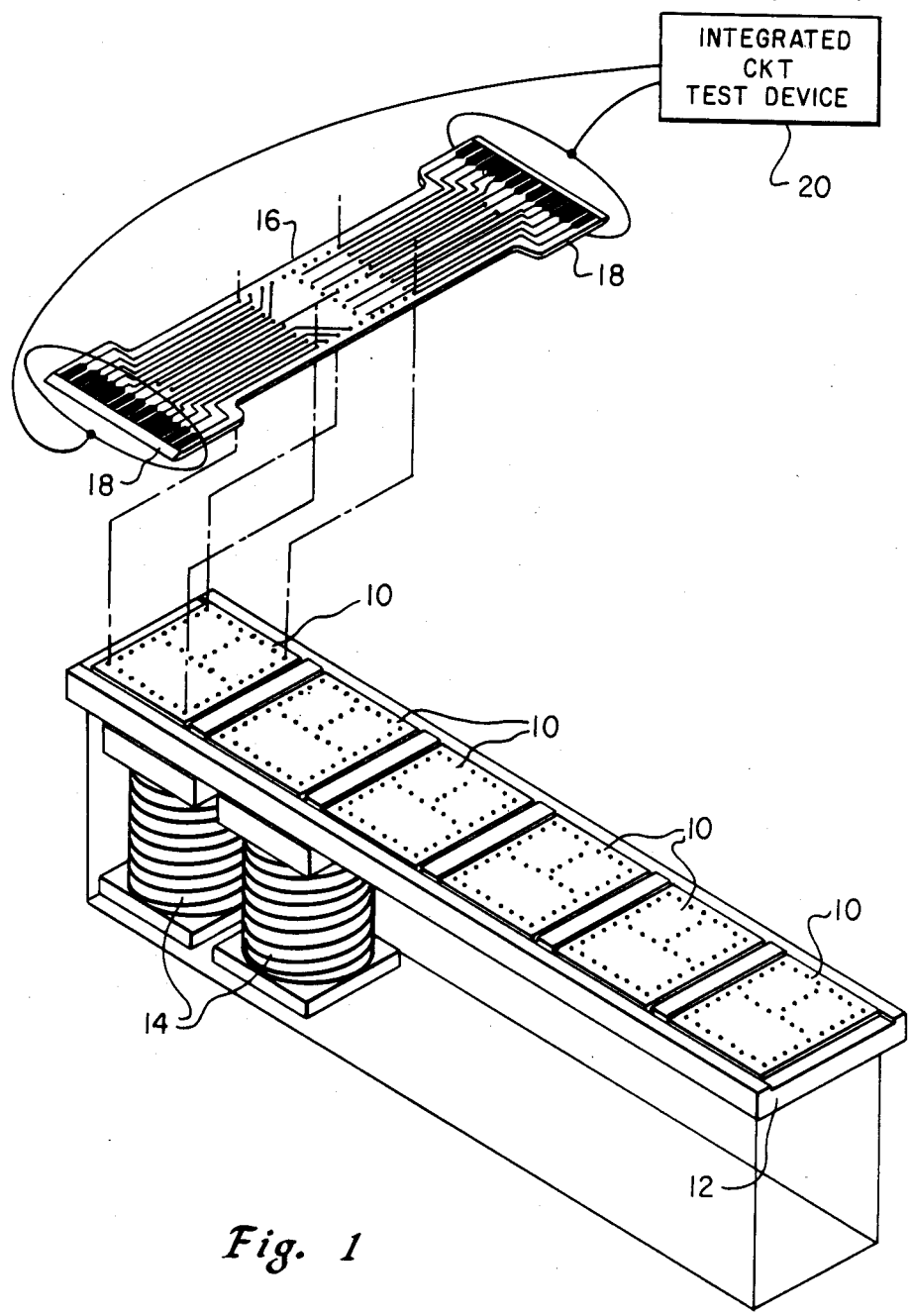
FIG. 1 depicts a pictorial schematic representation of an integrated circuit device testing apparatus constructed in accordance with the method of the present invention.

With reference now to the figures and in particular with reference to FIG. 1, there is depicted a pictorial schematic representation of an integrated circuit device testing apparatus which is constructed in accordance with the method of the present invention. As may be seen, the integrated circuit device testing apparatus may be utilized to test a plurality of integrated circuit devices 10, which are preferably mounted within carrier 12.

Those skilled in the art will appreciate that by mounting a plurality of integrated circuit devices 10 within a carrier 12, a plurality of similar integrated circuit devices may be tested and those faulty devices discovered during such testing may be removed from carrier 12 until such time as carrier 12 contains a plurality of integrated circuit devices 10 which have all passed the appropriate tests.

A cover (not shown) may then be attached to carrier 12, much like a match box cover and carrier 12 may then be utilized to transport properly tested integrated circuit devices 10 to a device which will be utilized to insert integrated circuit devices 10 into an appropriate electronic device or printed circuit board. In this manner, integrated circuit devices 10 may not need to be handled after testing. It is believed that this technique for testing and insertion will result in improved yield and productivity.

As is illustrated in FIG. 1, in accordance with an important aspect of the present invention, one or more electromagnets 14 are disposed beneath carrier 12, each electromagnet disposed beneath a corresponding integrated circuit device 10. In this manner, it will be possible to simultaneously test a plurality of integrated circuit devices 10 similarly while utilizing the method of the present invention. For purposes of clarity, only two electromagnets 14 are illustrated; however, it is intended that the method of the present invention may be practiced utilizing any number of such electromagnets.

Corresponding to each electromagnet 14, and disposed, in the depicted embodiment of the present invention, above each integrated circuit 10 is a ferromagnetic test substrate 16. In the depicted embodiment of the present invention each ferromagnetic test substrate 16 is constructed utilizing a conductive core which has magnetic properties. One such example is a core which is constructed of a copper-invar-copper layered material.

Selected conductive points within ferromagnetic test substrate 16 are then coupled, via surface circuitry, in a manner well known in the art, to edge connectors 18. One or more edge connectors 18 may then be utilized with each ferromagnetic test substrate 16 to permit each ferromagnetic test substrate 16 to be coupled to integrated circuit test device 20. Integrated circuit test device 20 may be provided, utilizing any well known integrated circuit test device such as the J937 Memory Tester, manufactured by Teradyne.

Thus, as will be explained in greater detail herein, it is possible to urge ferromagnetic test substrate 16 into electrical contact with various electrical contact points associated with each integrated circuit device 10, by moving ferromagnetic test substrate 16 downward in response to the magnetic field generated by the selective energization of electromagnetic 14. In this manner, the electrical contact points within integrated circuit 10 may be accurately and rapidly interconnected to integrated circuit test device 20, so that each integrated circuit device 10 may be tested.

Figure 2:
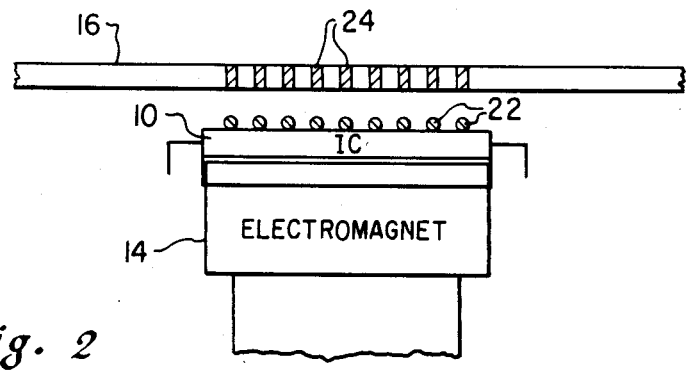
FIG. 2 depicts in schematic form a side view of an integrated circuit device testing apparatus constructed in accordance with the method of the present invention.

Referring now to FIG. 2, there is depicted in schematic form a side view of an integrated circuit device testing apparatus constructed in accordance with the method of the present invention which more clearly illustrates the method of electrical connection which is utilized. As is illustrated, the upper surface of integrated circuit 10, as positioned in FIG. 2, includes a plurality of electrical contact points 22.

In the depicted embodiment of the present invention, electrical contact points 22 comprise a plurality of solder balls which are utilized, in a manner which is commonly known in the art of solder reflow as controlled collapse chip connection (C4) technology. U.S. Pat. Nos. 3,401,126 and 3,429,040 to Lewis F. Miller and assigned to the assignee of the present application disclose this technique whereby the controlled collapse chip connection technique of face down bonding of a semiconductor chip to a carrier may be established.

In general, the techniques described in the Miller patents disclose the formation of a malleable pad of metallic solder on the semiconductor device contact site and the solder joinable sites of the conductors of the chip carrier. The device carrier solder joinable sites are surrounded by non-solderable barriers such that when the solder on the semiconductor device contacts sites melts, surface tension will hold the semiconductor device suspended above the carrier.

Associated with and disposed directly above each electrical contact point 22 of integrated circuit device 10 is a corresponding electrical contact point 24 within ferromagnetic test substrate 16. In the depicted embodiment of the present invention, each electrical contact point 24 within ferromagnetic test substrate 16 constitutes a hole or "via" which has been provided within ferromagnetic test substrate 16 and which is electrically coupled, via techniques well known in the art, to circuitry which is disposed on one or both surfaces of ferromagnetic test substrate 16.

Thus, upon the energization of electromagnet 14, ferromagnetic test substrate 16 will be urged downward by the magnetic field generated, and upon proper alignment of electrical contact points 24 within ferromagnetic test substrate 16 with electrical contact points 22 of integrated circuit device 10, will cause a rapid and accurate electrical connection to be made with various points within integrated circuit device 10, thus permitting accurate testing thereof.

While the electrical connection scheme which is disclosed herein utilizes as its depicted embodiment the controlled collapse chip connection technology disclosed in the aforementioned patents to Miller, those skilled in the art will appreciate that any suitable technique whereby corresponding electrical contact points have been generated may be utilized with the integrated circuit device testing apparatus of the present invention.

For example, U.S. patent application Ser. No. 07/459,087, filed Dec. 29, 1989, entitled "Multi-Level Circuit Structure and Method for Construction Thereof," and assigned to the assignee hereof discloses a technique for creating electrical connections between multi-level circuit card structures which utilizes a plurality of imprinted substrates or dimples to permit electrical connection between overlying layers within the circuit card structure. This technique may also be utilized in conjunction with the integrated circuit device testing apparatus of the present invention to permit selective electrical contact between convex electrical contact points located on integrated circuit device 10 and concave electrical contact points located within ferromagnetic test substrate 16, in accordance with the teachings of the aforementioned patent application. Similarly, the provision of solder balls or other convex electrical contact points within ferromagnetic test substrate 16 may be utilized with corresponding "vias" or other concave electrical contact points within an integrated circuit device.

Figure 3:
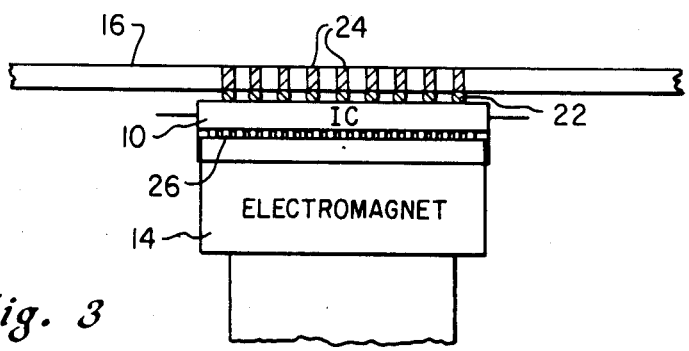
FIG. 3 depicts in schematic form a side view of a second embodiment of an integrated circuit device testing apparatus constructed in accordance with the method of the present invention.

With reference now to FIG. 3, there is depicted in schematic form a side view of a second embodiment of an integrated circuit device testing apparatus constructed in accordance with the method of the present invention. As discussed above with respect to FIG. 2, within FIG. 3 ferromagnetic test substrate 16 has been urged downward by the magnetic field into contact with integrated circuit device 10, causing a plurality of electrical contact points 24 within ferromagnetic test substrate 16 to be urged into electrical connection with various contact points 22 within integrated circuit device 10.

In accordance with this embodiment of the integrated circuit device testing apparatus of the present invention, an electrical heater coil 26 is also provided on the upper planar surface of electromagnet 14. In this manner, it will be possible to repeatedly cycle integrated circuit device 10 through a plurality of testing cycles while simultaneously applying current to heater coil 26 in order to raise the ambient temperature in the vicinity of integrated circuit device 10. Thus, rather than requiring the entire integrated circuit device to be placed within an environmentally controlled chamber, it will be possible, at much lower energy levels, to raise the ambient temperature of integrated circuit device 10 during testing thereof by the selective utilization of heater coil 26.

In accordance with another important feature of the present invention, it should be appreciated that by constructing ferromagnetic test substrate 16 utilizing a process which is substantially similar to the process utilized to manufacture integrated circuit devices 10, ferromagnetic test substrate 16 and integrated circuit device 10 will be thermally matched. That is, ferromagnetic test substrate 16 and integrated circuit device 10 will demonstrate substantially similar thermal coefficients of expansion and contraction. Thus, upon the application of heat due to the selective energization of heater coil 26 the electrical connection which has been established between ferromagnetic test substrate 16 and integrate circuit device 10 will be maintained.

Figure 4:
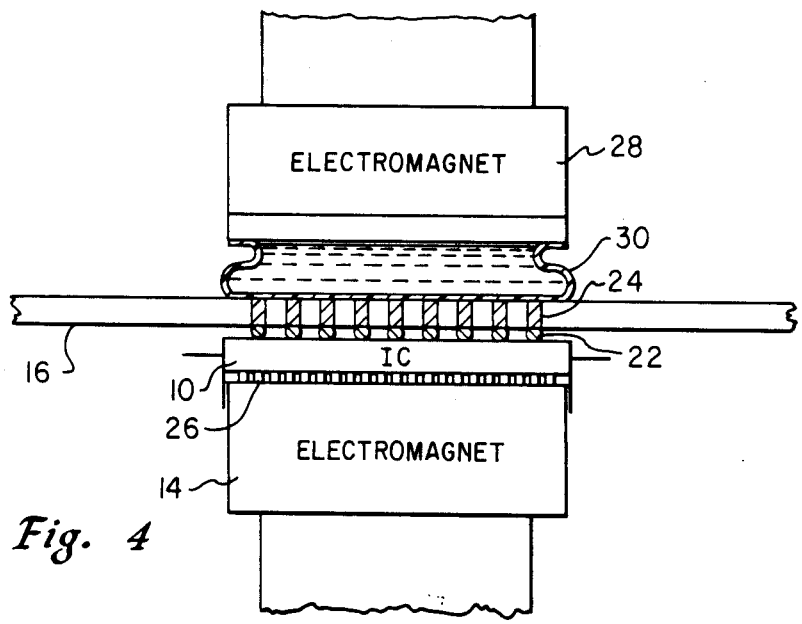
FIG. 4 depicts in schematic form a side view of a third embodiment of an integrated circuit device testing apparatus constructed in accordance with the method of the present invention.

Finally, referring to FIG. 4, there is depicted in schematic form a side view of a third embodiment of an integrated circuit device testing apparatus which has been constructed in accordance with the method of the present invention. As is illustrated in FIG. 4, a second electromagnet 28 has been provided. Electromagnet 28 is preferably constructed so as to demonstrate a magnetic polarity which is opposite to that of electromagnet 14. Thus, as those skilled in the basic magnetic arts will appreciate, upon the selective energization of electromagnet 14 and electromagnet 28 the two electromagnets will be urged together, since opposite magnetic poles will attract each other.

Attached to the lower planar surface of electromagnet 28 is a fluid bag 30 which is preferably a pliable container filled with an appropriate fluid which may be utilized to uniformly distribute the pressure generated by the attraction between electromagnet 28 and electromagnet 14 over the surface of ferromagnetic test substrate 16. Those skilled in the art should appreciate that measuring the fluid pressure within fluid bag 30 it will be possible to control the pressure utilized to urge ferromagnetic test substrate into electrical connection with integrated circuit device 10 by varying the currents applied to electromagnet 14 and electromagnet 28.

Upon reference to the foregoing specification, those skilled in the art will appreciate that the Applicants have provided a technique whereby integrated circuit devices which are not contained within standard packaging may be rapidly and accurately tested in an environmentally controlled situation. The necessity of manually handling such devices has been eliminated and the accuracy of testing has been greatly increased. Of course, those skilled in the art will appreciate that in situations where integrated circuit device 10 includes a ferromagnetic core material the relative positions of ferromagnetic test substrate 16 and integrated circuit device 10 with regard to electromagnet 14 may be simply and easily reversed without departing from the spirit of the present invention.

While the invention has been particularly shown and described with reference to a preferred embodiment, it will be understood by those skilled in the art that various changes in form and detail may be made therein without departing from the spirit and scope of the invention.

We claim:

1. A method for testing an integrated circuit device having a plurality of electrical contact points, said method comprising the steps of:

positioning an integrated circuit device having a plurality of contact points proximate to a first electromagnet;

positioning a ferromagnetic test substrate having a plurality of electrical contact points corresponding to said plurality of electrical contact points within said integrated circuit device proximate to said integrated circuit device;

coupling said plurality of electrical contact points within said ferromagnetic test substrate to an integrated circuit device tester; and selectively energizing said first electromagnet wherein said ferromagnetic test substrate and said plurality of electrical contact points therein are temporarily urged into electrical contact with said plurality of electrical contact points within said integrated circuit device whereby said integrated circuit device is temporarily electrically connected to said integrated circuit device tester.

2. The method for testing an integrated circuit device according to claim 1 further including the step of disposing an electrical heater coil proximate to said integrated circuit device.

3. The method for testing an integrated circuit device according to claim 2 further including the step of selectively energizing said electrical heater coil during testing of said integrated circuit device.

4. The method for testing an integrated circuit device according to claim 1 further including the step of positioning a second electromagnet opposite said first electromagnet, said second electromagnet having opposite magnetic polarity to said first electromagnet such that upon selective energization of said first electromagnet and second electromagnet said electromagnets are urged together.

5. The method for testing an integrated circuit device according to claim 4 further including the step of positioning a flexible cushion between said first electromagnet and second electromagnet wherein pressure between said first electromagnet and said second electromagnet may be equally distributed.

6. An apparatus for testing integrated circuit devices having a plurality of electrical contact points, said apparatus comprising:

a first electromagnet having a planar surface adapted to receive an integrated circuit device having a plurality of electrical contact points;

a ferromagnetic test substrate having a plurality of electrical contact points corresponding to said plurality of electrical contact points within said integrated circuit device and disposed proximate to said planar surface; and an integrated circuit device tester coupled to said plurality of electrical contact points within said ferromagnetic test substrate wherein selective energization of said first electromagnet will urge said plurality of electrical contact points within said ferromagnetic test substrate into temporary electrical connection with said plurality of electrical contact points within said integrated circuit device whereby said integrated circuit device may be temporarily coupled to said integrated circuit device tester.

7. The apparatus for testing integrated circuit devices according to claim 6 further including an electric heater coil disposed proximate to said planar surface wherein an integrated circuit device under test may be selectively heated by energization thereof.

8. The apparatus for testing integrated circuit devices according to claim 6 further including a second electromagnet having opposite magnetic plurality to said first electromagnet and disposed opposite said first electromagnet such that upon selective energization of said first electromagnet and second electromagnet said electromagnets are urged together.

9. The apparatus for testing integrated circuit devices according to claim 8 further including a flexible cushion means disposed between said first electromagnet and second electromagnet.

10. The apparatus for testing integrated circuit devices according to claim 9 wherein said flexible cushion means comprises a fluid filled bag.

11. The apparatus for testing integrated circuit devices according to claim 6 wherein said plurality of electrical contact points within said ferromagnetic test substrate comprise a plurality of apertures adapted to receive a plurality of extended electrical contact points within said integrated circuit device.

12. The apparatus for testing integrated circuit devices according to claim 6 wherein said ferromagnetic test substrate is constructed of a thin flexible metallic substance.

13. The apparatus for testing integrated circuit devices according to claim 12 wherein said ferromagnetic test substrate is manufactured utilizing a process substantially similar to the process utilized to create said integrated circuit device wherein said ferromagnetic test substrate and said integrated circuit device are thermally matched.

14. The apparatus for testing integrated circuit devices according to claim 12 wherein said thin flexible metallic substance comprises a strip of copper-invar-copper.

* * * * *